United States Patent [19]

Kawamura

[11] 4,113,815
[45] Sep. 12, 1978

[54] METHOD FOR MANUFACTURING COMPOSITION INCLUDING FINE PARTICLES DISPERSED THEREIN

[76] Inventor: Yuzo Kawamura, 6-14-304, Honmaru-cho, Ohtsu-shi, Shiga-ken, Japan

[21] Appl. No.: 688,639

[22] Filed: May 21, 1976

Related U.S. Application Data

[63] Continuation-in-part of Ser. No. 487,581, Jul. 11, 1974, abandoned, which is a continuation of Ser. No. 246,604, Apr. 24, 1972, abandoned, which is a continuation of Ser. No. 40,229, May 25, 1970, abandoned.

[51] Int. Cl.² ............................................. B01J 2/24
[52] U.S. Cl. .................................... 264/101; 264/140
[58] Field of Search ............... 264/81, 101, 115, 140, 264/118; 427/251, 289; 106/290, 291, 308 M

[56] References Cited

U.S. PATENT DOCUMENTS

| 2,464,157 | 3/1949 | Scheer et al. | 264/81 |
| 2,839,378 | 6/1958 | McAdow | 106/290 |
| 3,082,144 | 3/1963 | Haley | 264/101 |
| 3,089,196 | 5/1963 | Knapp et al. | 264/110 |
| 3,294,880 | 12/1966 | Turkat | 264/81 |

Primary Examiner—Robert F. White
Assistant Examiner—James R. Hall
Attorney, Agent, or Firm—Eugene E. Geoffrey, Jr.

[57] ABSTRACT

A pigmented composition which is produced by forming a thin layer of thermoplastic resin, depositing a film of pigmenting material onto the surface thereof, and then agitating the layer with the film thereon to break it into pieces to form said composition.

3 Claims, 1 Drawing Figure

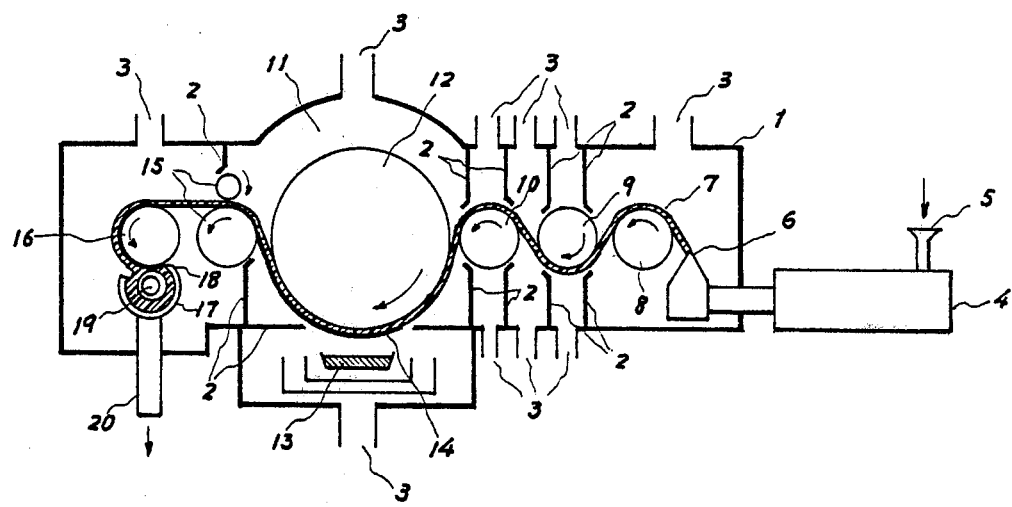

METHOD FOR MANUFACTURING COMPOSITION INCLUDING FINE PARTICLES DISPERSED THEREIN

This application is a Continuation in Part of Application Ser. No. 487,581, filed July 11, 1974, entitled METHOD OF AND DEVICE FOR MANUFACTURING COMPOSITION INCLUDING FINE PARTICLES DISPOSED THEREIN, now abandoned, which was a Continuation of Ser. No. 246,604, filed Apr. 24, 1972, now abandoned, which was a continuation of Ser. No. 40,229, filed May 25, 1970, now abandoned.

This invention relates to a novel and improved method of manufacturing masterbatch.

Masterbatch is a composition prepared by adding a large quantity of pigment and additives in resinous material, especially, in thermoplastic synthetic resin, and is commercially available in a form of pellets or bullets in general. Masterbatch is generally used for preparing paints and printing inks by adding solvents and other additives and for making molded articles, sheets and thin films by adding clear resins. According to prior art methods, masterbatch has been made by adding pigment particles in molten resin and dispersing the former in the latter uniformly by agitation. However, the products of such prior art methods had poor coloring property, molded articles therefrom had poor appearance and paints therefrom exhibited low masking power and reflectivity. In order to improve these properties, it was required to add a large quantity of expensive pigment particles.

Though it has been known that the above properties would be effectively improved by using flake-like pigment particles rather than conventional round particles, high reflectivity and brilliancy have not yet been obtained and uses for decorations and reflecting materials have not been sufficed.

Generally speaking, the masking power of a pigment is proportional to the diameter of a pigment particle and inversely proportional to the thickness thereof, so that the greater the diameter-to-thickness ratio, the higher the masking power. However, it is very difficult to produce pigment particles having a large diameter-to-thickness ratio and, for example, it is limited to only about 80 in case of aluminium. On the contrary, with increase of the diameter-to-thickness ratio, dispersion of pigments in resin becomes poorer and intermixing operation becomes very difficult. Thus, the prior art methods have had a severe disadvantage in that there has been an inconsistency between improvements in performance and process. Furthermore, the flake-like pigment particles have had such an additional disadvantage that, in addition to impossibility of obtaining perfect smooth surfaces, no uniform particle size has been obtainable and random reflection has been promoted by fine particles included unavoidably.

Accordingly, an object of this invention is to provide a novel and improved method of masterbatch which includes flake-like pigment particles having very large diameter-to-thickness ratio, a smooth mirror surface and uniform particle size so that it can produce beautiful brilliant molded articles, sheets and films having high reflectivity and paints and inks having large masking power, even with very low content of pigment.

The method of this invention is characterized by the steps of forming a thin film of thermoplastic resin, evaporating a pigment material onto a surface of said thin film in a vacuum to form a thin film of said pigment material on said surface and collecting said layer of thermoplastic resin with said pigment film and agitating them at elevated temperature to break said pigment film into pieces.

Now, the invention will be described in detail in conjunction with certain embodiments and with reference to the accompanying drawing.

The single drawing is a schematic view illustrating one embodiment according to this invention.

In the drawing, a vacuum chamber 1 is divided into a plurality of sub-chambers by partitions 2 in order to maintain a pressure gradient along the horizontal axis of the chamber 1, and the sub-chambers are respectively evacuated through exhaust tubes 3 by individual vacuum pump systems (not shown). At one end of the vacuum chamber 1, provided is a synthetic resin film extruder 4 of a known type which can melt a thermoplastic resin material supplied from a hopper 5 and extrude it from a die slit 6 as a synthetic resin film 7. It is advantageous in view of both vacuum maintenance and film formation to arrange the extruder 4 so that the die slit 6 is located in the vacuum chamber 1 while the hopper 5 is outside of it, as compared with the case of locating the both die slit 6 and hopper 5 out of the vacuum chamber 1 and leading the film 7 into the chamber 1.

The extruded film 7 is guided by rollers 8, 9 and 10 through the sub-chambers maintained respectively at successively increasing degrees of vacuum and enters an evaporation chamber 11 of the highest degree of vacuum. Under a guide roller 12 of the evaporation chamber 11, there is located an evaporation source 13 which is heated at a predetermined temperature by a suitable heat source (not shown) such as an electric heater. The evaporation source 13 contains a melt of pigment material which is evaporated to form an evaporated film 14 on a surface of the synthetic resin film 7. The evaporation process is well known in the art and further description is not deemed necessary. (See Electronics and Nuclear Engineering by Sarbacher, Prentice Hall, Inc., 1959, page 465.) The resin film 7 with the evaporated film is guided by feed rollers 15 and wound on a winding roller 16. The winding roller 16 is heated to melt the resin film 7 and the film 7 is scraped off the roller 16 by a doctor blade 18 of a scraper 17 and, at the same time, it is agitated by a screw feeder 19 and discharged through the outlet port 20.

Due to the agitating action of the screw feeder 19, the evaporated film 14 is broken into flake-like small pieces and intermixed in the synthetic resin to form the masterbatch. The size of the flakes can be varied by changing the speed of rotation of the screw feeder 19 and, if necessary, it can be made finer by a separate agitator after it is exhausted from the outlet port 20. The masterbatch thus obtained is shaped into pellets or bullets by a conventional pellet former (not shown) and supplied for various uses.

The fine pieces or particles of the evaporated pigment material dispersed in the masterbatch prepared as above have extremely low dispersion of particle size and very smooth mirror surfaces and the diameter-to-thickness ratio can be made extremely large, for example, as large as 1000 in case of aluminium pigment. Therefore, the masterbatch produced by the method of this invention has a superior coloring property and masking power with less content of pigment as compared with the prior art pigments and, accordingly, the products therefrom exhibit high brilliancy and reflectivity and very beautiful appearance. Moreover, it is highly suited for mass-production since almost the whole process can be automated as described above.

Instead of scraping the two films from the winding roller 16, it may be wound on the roller 16, taken out of the chamber 1 and agitated by a separate known agitator or kneader (not shown) at elevated temperature. Especially, in case of preparing paints, it is convenient to dissolve the wound film in a vessel (not shown) with a suitable solvent and, thereafter, agitating it to break the evaporated pigment film 14 by known agitating means (not shown).

EXAMPLE 1

Low density polyethylene of 0.91 to 0.925 specific gravity was extruded and stretched from the die slit 6 of 0.2 millimeter thickness at a temperature of 180 to 200° C in the vacuum chamber 1 at 5 to 10 Torr. vacuum, and cooled by the rollers 8, 9 and 10 at 20° C or lower to form a thin film of 2 to 5 micron thickness which was then led into the evaporation chamber 11 at about $10^{-4}$ Torr. vacuum. The speed of motion of the film 7 was controlled at 3 to 6 meters per second. When an aluminium ingot was molten as the evaporation source 13, an aluminium film 14 of about 0.05 to 0.1 micron thickness was formed. The combined evaporated film 14 and polyethylene film 7 were wound on the winding roller 16, scraped off by the scraper 17 at the same time and then agitated by the screw feeder 19. The temperature of the roller 16 was selected as about 200° C.

When the thicknesses of the polyethylene film 7 and the aluminium evaporation film 14 were 2 microns and 0.1 micron, respectively, in the above conditions, the aluminium content of the produced masterbatch was 13 percent by weight. The reflectivity of a thin film of 5 micron thickness made of this product was measured as about 70 percent, while that of another thin film of the same thickness made of prior art masterbatch containing flaked aluminium particles of 20 percent by weight was measured as 50 percent. Practically, the former film of this example appeared visually in bright metallic silver luster, while the latter one appeared in dark gray.

In other words, according to this invention, a similar or higher reflectivity can be obtained with a pigment content of only one tenth of the necessary content of the prior art and, especially, when used as a film, a high radiation (heat ray) shielding power can be realized. This radiation shielding polyethylene film is highly useful for agricultural purposes and the method of making such film suitable for this purpose is described in the specification of U.S. Pat. No. 3,276,943 granted to the same inventor, for example.

EXAMPLE 2

Celluose acetate-butylate was extruded and stretched from the die slit 6 of 0.2 millimeters thickness at 190° to 210° C in a vacuum of about 10 to 20 Torr. and cooled by the rollers at 25° C or lower to form a film of 1 to 3 microns thickness. In this case, a vented extruder was preferably used in order to drive moisture and gases out of the material. The celluose acetate-butylate film 7 was introduced into the evaporation chamber 11 at about $10^{-4}$ Torr. vacuum with a speed of motion of about 3 to 6 meters per second and an aluminium film of about 0.01 to 0.1 micron thickness was evaporated as in the case of Example 1. The product was exhausted from the chamber 1 and shaped into pellets.

The masterbatch as prepared in this example is especially suitable for use as a material of paint for metallic articles. For example, a very beautiful silver paint having very uniform particle size of pigment and exhibiting high masking power is obtained by putting the above masterbatch pellets in a dissolving tank, dissolving them in a solvent such as methyl acetate, butyl acetate, ethylene dichloride, cellosolve, acetone or dioxane or a mixture thereof with toluene, xylene or the like and, thereafter, agitating the solution by a ball mill or the like to break the evaporated film into pieces of suitable size. Furthermore, highly reflective paints and printing inks can also be prepared by intermixing this paint with such materials as resin ester, dammer gum, acrylic resin, melamine resin, alkyd resin, polyurethane resin, epoxy resin and the like.

In case of manufacturing paints from the masterbatch made in accordance with this invention, the same result and simplification of process can be obtained by winding the two films 7 and 14 on the roller 16 without scraping with the scraper 17, and taking them out of the chamber 1 to throw into a dissolving tank together with the roller.

The synthetic resin used as the basic material in the method of this invention can be arbitrarily selected in accordance with use of the produced masterbatch. Such resins as polyethylene, polypropylene, polycarbonates, polystylene, ethylene-vinyl acetate copolymer, polyvinyl butylal, polyesters such as polyethylene terephthalate, cellulose acetate-butylate, cellulose propyonate and cellulose triacetate are of course usable and, in addition, a further variety of materials can be used if the supporting resin layer is formed by painting or evaporation on a surface of a drum or an endless belt instead of forming it as a self-supporting film as in the embodiment of the drawing, and this is also in the range of this invention.

Any material which can be evaporated in a vacuum is usuable as the pigment material of this invention but it must of course be selected in accordance with the use of masterbatch. Masterbatch containing aluminium as in the above embodiments is useful for manufacturing films and paints having high reflectivity and high heat shielding property, but such metals as gold, copper and brass and, moreover, non-metals such as zinc sulfide, stannic oxide, magnesium fluoride and carbonates and sulfates of lead, zinc and bismuth are also usable as the pigments of masterbatches used as the materials of paints, inks and shaped goods for decorative use. Especially, the use of masterbatches containing those non-metallic materials as above as the pigments produce paints and molded articles which exhibit beautiful pearl-like appearance and are effective to manufacture artificial pearls.

Various processing conditions such as melting temperature, roller temperature and film feeding speed must be controlled optimumly in accordance with the conditions of the materials used and the products. It is necessary to uniformly control the thickness of the base film and that of the evaporated film since they are important factors which determine the pigment content in the product. The thickness of the evaporated film decides also the particle size of pigment dispersed in the resultant product. More specifically, it is to be thin in case of expecting fine particles, while it is to be thick in case of expecting large particles. In any case, however, the diameter-to-thickness ratio of the particles can be made as large as 1000, in contrast to about 80 which is the limit of the prior art method, and this is the greatest reason why the performance of masterbatch according to this invention is particularly superior to that of prior ones.

What is claimed is:

1. A method of manufacturing a master batch of a synthetic thermoplastic resin containing flake pigment particles having a substantially smooth mirror surface, a substantially uniform particle size and a diameter/thickness of as large as 1000, comprising
   a. moving a thin film of synthetic thermoplastic resin having uniformly controlled thickness through a vacuum chamber,
   b. subjecting a mass of the material for forming said pigment particles to evaporation within said vacuum chamber and depositing said evaporated material as a thin film having a uniformly controlled thickness upon one surface of said moving resin film, and
   c. heating said moving films to melt said thermoplastic resin film, and
   d. subjecting said molten resin and said deposited film to agitation to break up said deposited film into said pigment flake particles within said resin to form said master batch.

2. The method according to claim 1 wherein step (a) comprises extruding said thermoplastic resin within said vacuum chamber from a die slit.

3. The method of claim 1 wherein step (c) comprises: winding said moving films on a heated roller, and step (d) comprises scraping said moving films from said roller and directing said resin and deposited film into a screw feeder for said agitation.

* * * * *